United States Patent [19]

Kano

[11] Patent Number: 5,661,041
[45] Date of Patent: Aug. 26, 1997

[54] CONDUCTIVE PASTE, SOLAR CELLS WITH GRID ELECTRODE MADE OF THE CONDUCTIVE PASTE, AND FABRICATION METHOD FOR SILICON SOLAR CELLS

[75] Inventor: Haruhiko Kano, Muko, Japan

[73] Assignee: Murata Manufacturing Co., Ltd., Japan

[21] Appl. No.: 560,197

[22] Filed: Nov. 21, 1995

[30] Foreign Application Priority Data

Nov. 24, 1994 [JP] Japan .................................. 6-290081

[51] Int. Cl.$^6$ .................................................. H01L 31/18
[52] U.S. Cl. ..................... 438/72; 136/256; 106/1.14; 106/1.19; 438/98; 438/609
[58] Field of Search ............................. 136/256; 437/2–5, 437/181, 187–188; 106/1.14, 1.19; 257/746, 749

[56] References Cited

U.S. PATENT DOCUMENTS 4,163,678  8/1979  Bube ........................................ 136/256
4,737,197  4/1988  Nagahara et al. ...................... 136/256

FOREIGN PATENT DOCUMENTS 59-168667  9/1984  Japan .............................. H01L 29/46

*Primary Examiner*—Aaron Weisstuch
*Attorney, Agent, or Firm*—Ostrolenk, Faber, Gerb & Soffen, LLP

[57] ABSTRACT

The conductive paste according to the present invention, used when forming an n-type layer formed on one surface of a p-type silicon semiconductor substrate and a conducting electrode, is characterized in that the conductive paste comprises silver powder, glass frit, silver phosphate and an organic vehicle, and the mixing ratio of the glass frit per 100 weight units of silver powder is within the range of not less than 1 weight unit and not more than 5 weight units and the mixing ratio of the silver phosphate per 100 weight units of silver powder is within the range of not less than 0.5 weight units and less than 5 weight units. As a result, a conductive paste with which large-scale reduction of the labor required when forming electrodes is obtained, a solar cell in which grid electrodes comprising this conductive paste are formed, and a fabrication method for the same are provided.

17 Claims, 1 Drawing Sheet

CONDUCTIVE PASTE, SOLAR CELLS WITH GRID ELECTRODE MADE OF THE CONDUCTIVE PASTE, AND FABRICATION METHOD FOR SILICON SOLAR CELLS

BACKGROUND OF THE INVENTION

1. Field of the Invention

The present invention relates to a conductive paste, a solar cell in which a grid electrode made of the conductive paste is formed, and a fabrication method for the same.

2. Description of the Background Art

A solar cell has a p-type silicon (Si) semiconductor substrate, an n-type layer formed in the surface region of the semiconductor substrate, and a conductive electrode connected to the n-type, layer. More specifically, as schematically shown in FIG. 1 and FIG. 2, a p-type silicon semiconductor substrate has typically a thickness of about 500 µm, and an n-type layer 2 is formed in the surface region of the p-type Si semiconductor substrate 1 to a depth on the order of 0.3 µm to 0.5 µm. Also, on the surface of the p-type Si semiconductor substrate 1 on which the n-type layer (the front surface) 2 is formed, grid electrodes 3 for extracting the negative (minus) potential from the n-type layer 2 and an antireflection coating 4 for increasing cell efficiency by means of a light confinement effect are formed. Also, on another surface of the p-type Si semiconductor substrate 1, the back surface electrode 5 for extracting the positive (plus) potential is formed. The busbars 6 for external connection are formed on the n-type layer 2 so as to be connected with all of the grid electrodes 3.

Such a solar cell is generally fabricated according to the following sequence. That is, firstly, the n-type layer 2 is formed on a surface of the p-type Si semiconductor substrate 1 by diffusion of n-type dopant impurities. Then an antireflection coating 4 comprising such oxides as $SiO_2$, $TiO_2$ and the like is formed on the surface of the n-type layer 2. Thereafter, an already partially prepared conductive paste, e.g. silver (Ag) paste, is screen printed and baked to form grid electrodes 3.

Then, by screen printing the conductive paste on another surface of the p-type Si semiconductor substrate 1 and baking it, a back surface electrode 5 is formed over the entire surface or in a spider web shape. Note that there are often cases where the back surface electrode 5 has a double layer structure of an aluminum (Al) electrode layer and a silver electrode layer. Subsequently, after pre-soldering is performed on the p-type Si semiconductor substrate 1 on which the grid electrodes 3 and the back surface electrode 5 are formed, terminal portions 6 for external connection are formed on the grid electrodes 3 by solder reflow, whereby the solar cells are completed.

However, in the case where the grid electrodes 3 are formed on the antireflection coating 4 in the conventional Solar cells, the insulative property of the antireflection coating 4 intervenes and satisfactory ohmic contact between the n-type impurity layer 2 and the grid electrodes 3 cannot be attained. As a result, when forming the grid electrodes 3, the antireflection coating 4 must be masked in anticipation of the formation positions of the grid electrodes 3 and pattern etching of the antireflection coating 4 must be performed, and it is further necessary to accurately perform position matching when printing the conductive paste. The requirements for such extremely complicated processes causes the disadvantage of incurring a large scale increase in the manufacturing cost.

SUMMARY OF THE INVENTION

The present invention has been proposed in light of the above disadvantage and has as its object to provide a conductive paste with which large-scale reduction of the labor required when forming electrodes can be devised, a solar cell in which grid electrodes comprising this conductive paste are formed, and a fabrication method for the same.

The conductive paste according to the present invention is a conductive paste which is used when forming an n-type layer on one surface of a p-type silicon semiconductor substrate and a conducting electrode, wherein the conductive paste comprises silver powder, glass frit, silver phosphate and an organic vehicle, the mixing ratio of the glass frit per 100 weight units of silver powder being within the range of not less than 1 weight unit and not more than 5 weight units and the mixing ratio of the silver phosphate per 100 weight units of silver powder being within the range of not less than 0.5 weight units and less than 5 weight units.

Also, the solar cell according to the present invention is a solar cell in which a grid electrode comprising the above conductive paste, i.e. a grid electrode comprising silver powder, glass frit and silver phosphate, the mixing ratio of the glass frit per 100 weight units of silver powder being within the range of not less than 1 weight unit and not more than 5 weight units and the mixing ratio of the silver phosphate per 100 weight units of silver powder being within the range of not less than 0.5 weight units and less than 5 weight units, is formed.

In addition, the method of fabricating the solar cells according to the present invention includes the step of forming an n-type layer on one surface of a p-type silicon semiconductor substrate and forming an antireflection coating comprising an oxide over the entire surface of the n-type layer and the step of forming the grid electrode by printing on the surface of the antireflection coating and then baking a conductive paste comprising silver powder, glass frit and silver phosphate, the mixing ratio of the glass frit per 100 weight units of silver powder being within a range of not less than 1 weight unit and not more than 5 weight units and the mixing ratio of the silver phosphate per 100 weight units of silver powder being within a range of not less than 0.5 weight units and less than 5 weight units.

BRIEF DESCRIPTION OF THE DRAWINGS

These and other features, aspects and advantages of the present invention will become better understood with reference to the following description, appended claims and accompanying drawings wherein

DETAILED DESCRIPTION OF THE INVENTION

Herebelow, an embodiment of the present invention will be explained based on the drawings. Note that in the explanation of the embodiment, a solar cell having the same structure as that shown in FIG. 1 and FIG. 2 according to the prior art is given as an example, and FIG. 3 is an enlarged cross-sectional view of same in an intermediate manufacturing state.

Figure 1:
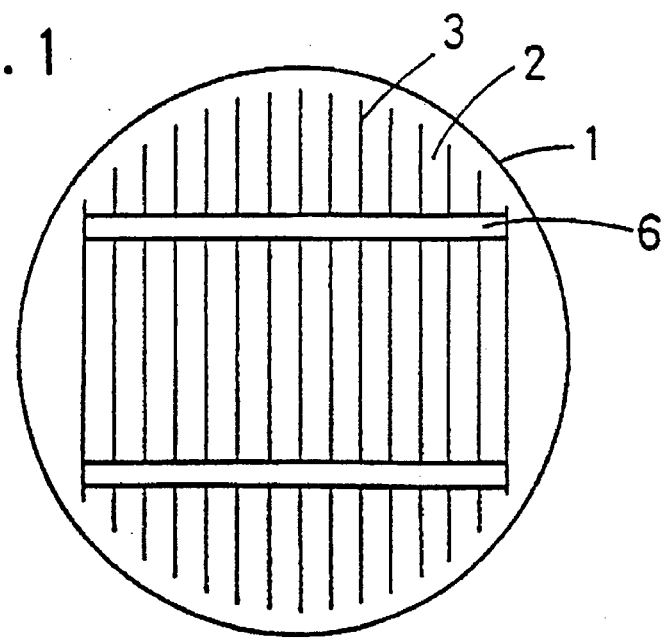
FIG. 1 is a plan view showing the plan structure of a solar cell of both the embodiment of the present invention and a prior art example.
Figure 2:
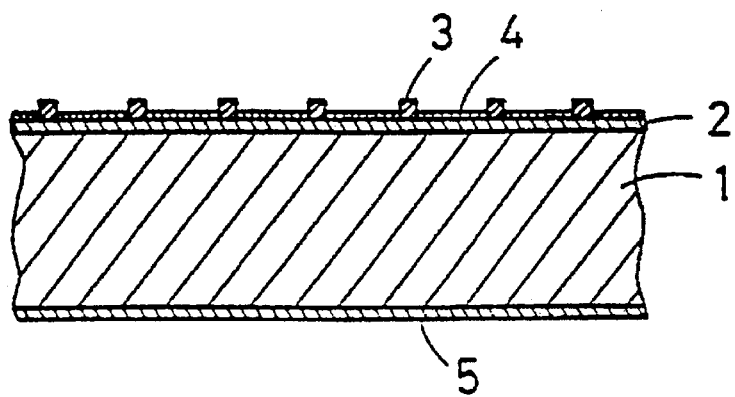
FIG. 2 is a cross-sectional view showing in enlarged form the cross-sectional structure of both the embodiment of the present invention and a prior art example.
Figure 3:
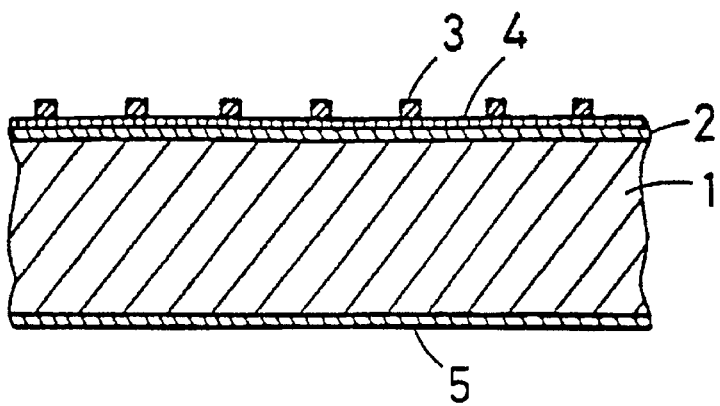
FIG. 3 is a cross-sectional view showing in enlarged form the structure in an intermediate state of the embodiment of the present invention.

The conductive paste according to the present invention is used when forming an n-type layer on one surface of a p-type Si semiconductor substrate and a conducting electrode, for example, the grid electrodes 3 of the solar cells shown in FIG. 1 and FIG. 2. This conductive paste is obtained by preparation of the pigments and an organic vehicle in a suitable mixing ratio. The pigments in the conductive paste comprise silver powder, glass frit, and silver phosphate, the mixing ratio of the glass frit per 100 weight units of silver powder being within the range of not less than 1 weight unit and not more than 5 weight units, preferably about 2–4 pph, and the mixing ratio of the silver phosphate per 100 weight units of silver powder being within the range of not less than 0.5 weight units and less than 5 weight units, preferably about 2–4 pph.

Note that here the average particle diameter of the silver powder determined by SEM (Scanning Electron Microscopy) is in the order of about 0.1 to 10 μm with a round or flake (flat) shape, and the softening point of the glass frit is about 500° C. or less, and it is preferably one or a mixture of the PbO—$SiO_2$—$B_2O_3$ group, $Bi_2O_3$—PbO—$SiO_2$—$B_2O_3$ group, ZnO—$SiO_2$—$B_2O_3$ group, etc. frits.

Also, the solar cell according to this embodiment, in the same manner as the conventional example shown in FIG. 1 and FIG. 2, is provided with a p-type Si semiconductor substrate 1. The p-type Si semiconductor substrate has a thickness on the order of 500 μm and an n-type layer 2 with a depth of about 0.3 μm to 0.5 μm formed on one surface thereof. Grid electrodes 3 and an antireflection coating 4 are formed on the front surface formed by the n-type layer 2. The grid electrodes 3 include silver powder, glass frit and silver phosphate, the mixing ratio of the glass frit per 100 weight units of silver powder being within the range of not less than 1 weight unit and not more than 5 weight units and the mixing ratio of the silver phosphate per 100 weight units of silver powder being within the range of not less than 0.5 weight units and less than 5 weight units. Further, the back surface electrode 5 is formed on the other surface of the p-type Si semiconductor substrate 1 and the busbars 6 for external connection are formed connecting all of the grid electrodes 3.

In this embodiment, firstly, the silver powder is prepared by mixing spherical silver particles having SEM particle diameters of approximately 0.1 μm and 1.5 to 2.5 μm and flake (flat) shaped silver particles having an SEM particle diameter of 4 to 5 μm in a 1:3:6 ratio. The powder generally constitutes about 40–90 w%, preferably about 65–80 w%, of the paste. The PbO—$SiO_2$—$B_2O_3$ group glass frit with a softening point of 430° C. and the silver phosphate which can be any one of silver orthophosphate ($Ag_3PO_4$), silver pyrophosphate ($Ag_4P_2O_7$) and silver metaphosphate ($AgPO_3$), are prepared as the powder. An organic vehicle is also prepared by dissolving 15 weight units of ethyl cellulose and 85 weight units of terpineol. Note that for the organic vehicle here, it is acceptable to use only a normal burn out type organic vehicle where an organic binder such as an acrylic or cellulose group material is dissolved in an organic solvent such as terpineol or ethylene glycol monoethyl ether. In general, the vehicle will constitute about 8–55 w%, preferably about 15–30 w%, of the paste.

Then, the glass frit and silver phosphate in mixing ratios with respect to 100 weight units of silver powder are each prepared as shown by samples 1 to 12 in Table 1, and after 25 weight units of the organic vehicle are added to 75 weight units of the solid portion, the conductive paste is manufactured by sufficiently kneading and dissolving these using well-known triple rollers. Note that the conductive pastes of each of samples 1, 2, 4, 7, 8, 11 and 12 in Table 1 are within the scope of the present invention and samples 3, 5, 6, 9 and 10 are conductive pastes which are outside the scope of the present invention.

TABLE 1

Mixing Ratio of Each Type of Component per 100 weight units of Silver Powder
(Units: weight units)

| Sample No. | Glass frit | Silver orthophosphate | Silver pyrophosphate | Silver Metaphosphate |
|---|---|---|---|---|
| 1 | 3.0 | 3.0 | — | — |
| 2 | 1.0 | 3.0 | — | — |
| 3* | 0.8 | 3.0 | — | — |
| 4 | 5.0 | 3.0 | — | — |
| 5* | 5.5 | 3.0 | — | — |
| 6* | 3.0 | 0.4 | — | — |
| 7 | 3.0 | 0.5 | — | — |
| 8 | 3.0 | 2.0 | — | — |
| 9* | 3.0 | 5.0 | — | — |
| 10* | 3.0 | 6.0 | — | — |
| 11 | 3.0 | — | 2.0 | — |
| 12 | 3.0 | — | — | 2.0 |

Note:
*indicates those outside the scope of the present invention.

Next, the sequence when fabricating a solar cell by using each type of conductive paste shown in Table 1 will be explained. Firstly, the n-type layer 2 is formed to a predetermined depth in one surface of the p-type Si semiconductor substrate 1. The antireflection coating 4 made of an oxide such as $SiO_2$, $TiO_2$, etc., is formed over the entire surface on the n-type layer 2. Then, a conductive paste having good ohmic contact with the p-type Si semiconductor substrate 1 is coated and dried over the entire surface of, or in a spider web form on, the other surface of the p-type Si semiconductor substrate 1 by screen printing. The back surface electrode 5 having an Ag—Al double layer structure is formed by baking for 15 minutes in an infrared furnace, the maximum temperature of which is set at 700° C.

Subsequently, as shown in the cross-sectional drawing of FIG. 3, after coating and drying the conductive paste of samples 1 to 12 in a grid pattern by screen printing on the surface of the antireflection coating 4 formed over the entire surface of the n-type layer 2, the grid electrodes 3 are formed by baking for 5 minutes in the infrared furnace whose maximum temperature is set at 650° C. Thereafter, upon performing pre-soldering on the p-type Si semiconductor substrate 1 on which the grid, electrodes 3 and the back surface electrode 5 are formed as well as forming the busbars 6 for external connection on the grid electrodes 3 by soldering reflow, the solar cells are completed.

Further, upon studying the fill factor, solderability, and tensile strength of the solar cells fabricated according to the order described above, namely the solar cells provided with the grid electrodes 3 formed using the various types of conductive paste shown in Table 1, the results shown in Table 2 were obtained. Note that the solderability here is the result determined by visual observation using a mild activation rosin flux and after dipping the solar cells in eutectic solder containing 2% Ag maintained at a temperature of 220° C. Also, the tensile strength is the value of external force at which destruction occurs when pulled at a speed of 20 mm/min across a vertical direction perpendicular to the surface of the solar cells after a 1.5 mm wide ribbon-shaped metal terminal is reflow soldered to the grid electrodes 3.

TABLE 2

Results of Characteristic Study

| Sample No. | Fill Factor | Solderability | Tensile Strength (N) |
|---|---|---|---|
| 1 | 0.745 | good | 9.5 |
| 2 | 0.740 | good | 8.0 |
| 3 | 0.720 | good | 3.9 |
| 4 | 0.740 | good | 10.3 |
| 5 | 0.690 | not good | not measurable |
| 6 | 0.610 | good | 9.6 |
| 7 | 0.735 | good | 10.1 |
| 8 | 0.755 | good | 9.2 |
| 9 | 0.755 | not good | not measurable |
| 10 | 0.750 | not good | not measurable |
| 11 | 0.750 | good | 9.3 |
| 12 | 0.755 | good | 9.0 |

According to the characteristic study results shown in Table 2, it is understood that the fill factor and tensile strength which the solar cells must practically provide, namely a fill factor of 0.7 or more and a tensile strength of approximately 10 N, can be obtained and that a favorable solderability can be obtained with the grid electrodes 3 formed using each of the conductive pastes of samples 1, 2, 4, 7, 8, 11, and 12 which are within the scope of the present invention. Also, obtaining such results is thought to be due to the phenomenon known as "fired through".

Namely, although each of the conductive pastes within the scope of the present invention contains silver phosphate within a mixing ratio range of 0.5 weight units or more and less than 5 weight units with respect to 100 weight units of silver powder, the silver phosphate heated to more than 500° C. during the baking of the conductive paste starts to migrate in the antireflection coating 4 together with the softened glass frit, and when heated to 550° to 600° C., the silver phosphate penetrates the antireflection coating 4 and contacts the surface of the n-type impurity layer 2. Given this, since phosphorous (P) is an element which can be used as an n-type dopant impurity, it forms very good ohmic contact with the n-type layer 2 and good characteristics can be obtained therewith as shown by Table 2. Note that the silver powder within the conductive paste also has a flux function together with the sintering of the glass frit and reaches the surface of the n-type layer 2.

In contrast to this, where the grid electrodes 3 are formed using the conductive pastes of samples 3 and 5 in Table 2, whose glass frit mixing ratios are outside the scope of the present invention, unfavorable solderability or large scale reduction of tensile strength occur. Namely, as with the conductive paste of sample 3, when the mixing ratio of the glass frit is 1 weight unit or less, bonding with the Si semiconductor substrate is insufficient and as a result of the large scale reduction of the tensile strength after soldering of the ribbon-shaped metal terminal (interconnector) wiring connected to the front side electrode, it cannot be put to practical use. Also, as with sample 5, where the mixing ratio of the glass frit with respect to 100 weight units of the silver powder is 5 weight units or more, solderability becomes unfavorable and even soldering connection of the interconnector cannot be performed, so that a glass insulation layer which exists at the interface of the n-type layer 2 and the grid electrodes 3 expands and there is a reduction of ohmic contact.

On the other hand, the addition amounts of silver phosphate in the conductive pastes of samples 6, 9, and 10 in Table 2 are outside the scope of the present invention and in the grid electrodes 3 formed using these conductive pastes a reduction of fill factor, poor solderability and reduction in tensile strength can be seen. Also, according to the results thereof, where the mixing ratio of the silver phosphate is 0.5 weight units or less, good ohmic contact after fired through cannot be obtained and in addition, where 5 weight units or more of silver phosphate is added, as a result of reaching a saturation state, it is understood that the solderability of the grid electrodes 3 is extremely poor. Also, since silver phosphate is a compound whose conductivity is low, if too much is added, it is understood that linear resistance in the grid electrodes 3 increases and a reduction in the characteristic occurs.

As explained above, when using the conductive paste according to the present invention, it is possible to ensure ohmic contact between the electrodes and the n-type layer by merely coating the conductive paste which becomes the electrodes on the antireflection coating and baking it. As a result of this, the advantage that the time for fabricating the electrodes, which require a great deal of complicated labor in the prior art, can be greatly reduced and reduction of manufacturing costs can be attained.

What is claimed is:

1. A conductive paste for forming an electrode to be electrically connected with an n-type silicon semiconductor layer, said conductive paste comprising silver powder, glass frit, silver phosphate and an organic vehicle, wherein the mixing ratio of the glass frit per 100 weight units of silver powder is within the range of not less than 1 weight unit and not more than 5 weight units and the mixing ratio of the silver phosphate per 100 weight units of silver powder is within the range of not less than 0.5 weight units and less than 5 weight units.

2. The conductive paste of claim 1 in which the mixing ratio of the glass frit and the silver phosphate is about 2 to 4 parts per hundred parts of silver powder.

3. The conductive paste of claim 2 in which the silver phosphate is silver orthophosphate, silver pyrophosphate, or silver metaphosphate.

4. The conductive paste of claim 3 in which the silver powder is about 40 to 90 weight percent of the paste.

5. A method of fabricating a solar cell, comprising the steps of:

forming an n-type layer on one surface of a p-type silicon semiconductor substrate;

forming an antireflection coating comprising an oxide over the surface of the n-type impurity layer; and forming a grid electrode by applying to the surface of the antireflection coating a conductive paste comprising silver powder, glass frit, and silver phosphate having a mixing ratio of the glass frit per 100 weight units of silver powder within the range of not less than 1 weight unit and not more than 5 weight units and a mixing ratio of the silver phosphate per 100 weight units of silver powder within the range of not less than 0.5 weight units and less than 5 weight units.

6. A method of fabricating a solar cell according to claim 5 in which the mixing ratio of the glass frit and the silver phosphate is about 2 to 4 parts per hundred parts of silver powder.

7. A method of fabricating a solar cell according to claim 6 in which the silver powder is about 40 to 90 weight percent of the paste.

8. The method of fabricating the solar cells according to claim 7 in which the laminate formed by the p-type silicon semiconductor substrate, n-type layer, anti-reflection layer, and grid electrode paste is baked.

9. The method of fabricating a solar cell according to claim 8 in which the conductive paste is also applied to a surface of the p-type silicon semiconductor substrate on which there is no n-type layer.

10. The method of fabricating a solar cell according to claim 7 in which the conductive paste is also applied to a surface of the p-type silicon semiconductor substrate on which there is no n-type layer.

11. A method of fabricating a solar cell according to claim 5 in which the silver phosphate is silver orthophosphate; silver pyrophosphate, or silver metaphosphate.

12. The method of fabricating the solar cells according to claim 5 in which the laminate formed by the p-type silicon semiconductor substrate, n-type impurity layer, anti-reflection layer, and grid electrode is baked.

13. The method of fabricating a solar cell according to claim 12 in which the conductive paste is applied to a surface of the p-type silicon semiconductor substrate on which there is no n-type layer.

14. The method of fabricating a solar cell according to claim 5 in which the conductive paste is also applied to a surface of the p-type silicon semiconductor substrate on which there is no n-type layer.

15. A method of fabricating a solar cell according to claim 5 in which the silver powder is about 40 to 90 weight percent of the paste.

16. The method of fabricating the solar cells according to claim 15 in which the laminate formed by p-type silicon semiconductor substrate, n-type layer, anti-reflection layer, and grid electrode paste is baked.

17. The method of fabricating a solar cell according to claim 16 in which the conductive paste is also applied to a surface of the p-type silicon semiconductor substrate on which there is no n-type layer.

* * * * *